United States Patent [19]

Bourdon et al.

[11] 4,155,155

[45] May 22, 1979

[54] METHOD OF MANUFACTURING POWER SEMICONDUCTORS WITH PRESSED CONTACTS

[75] Inventors: Bernard Bourdon; Gaston Sifre, both of Orsay, France

[73] Assignee: Alsthom-Atlantique, Paris, France

[21] Appl. No.: 868,242

[22] Filed: Jan. 10, 1978

[30] Foreign Application Priority Data

Jan. 19, 1977 [FR] France .............................. 77 01433

[51] Int. Cl.² ............................................ H01L 21/44
[52] U.S. Cl. ........................................ 29/590; 29/589; 29/591; 156/630; 156/665; 427/89; 427/90; 427/91; 427/125; 427/229
[58] Field of Search .................... 427/89, 90, 91, 125, 427/229; 29/589, 590, 591; 156/630, 665

[56] References Cited

U.S. PATENT DOCUMENTS

| | | | |
|---|---|---|---|
| 3,007,092 | 10/1961 | Cooper | 427/125 |
| 3,037,180 | 5/1962 | Linz, Jr. | 427/89 |
| 3,222,216 | 12/1965 | Berkenblit et al. | 427/125 |
| 3,453,501 | 7/1969 | Dunkle | 427/91 |
| 3,545,076 | 12/1970 | Schulten | 427/91 |
| 3,993,515 | 11/1976 | Reichert | 427/91 |

FOREIGN PATENT DOCUMENTS

1488860 12/1977 United Kingdom.

*Primary Examiner*—John D. Smith
*Attorney, Agent, or Firm*—Sughrue, Rothwell, Mion, Zinn and Macpeak

[57] ABSTRACT

The invention relates to a method of manufacturing power semiconductors with pressed contacts and with an interdigitated structure. The thickest contact metal coverings are formed by application of a metal layer by serigraphy on a first thin metal layer deposited by evaporation in a vacuum.

3 Claims, 9 Drawing Figures

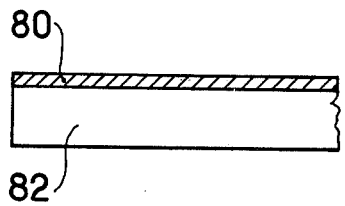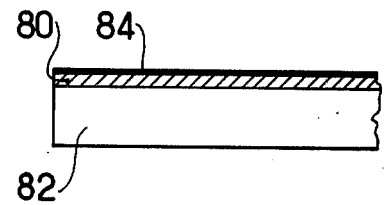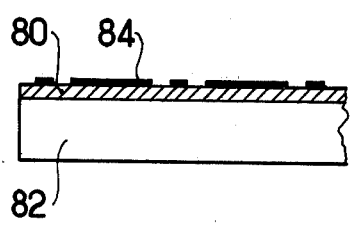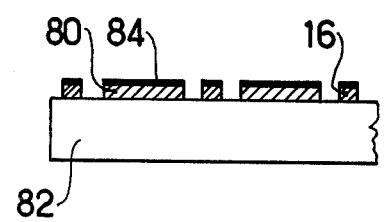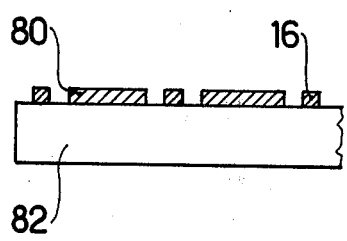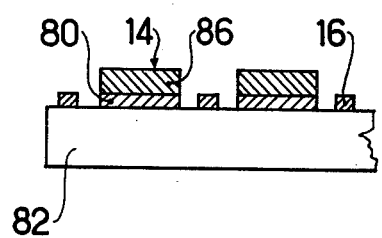

METHOD OF MANUFACTURING POWER SEMICONDUCTORS WITH PRESSED CONTACTS

FIELD OF THE INVENTION

The present invention relates to a method of manufacturing "pressed contact" semi-conductors, i.e., a device in which the electrical contact means between the semiconductor wafer and its encapsulation are constituted by metal contacts clamped more or less elastically against the wafer by the encapsulation or by an external radiator.

BACKGROUND OF THE INVENTION

In the case of high-power devices, the problems of electric contacts on the active parts of the unit where high currents pass and where there are problems of heat dissipation lead to the use of pressed contacts. These form a contact on a large surface, allow heat dissipation from both surfaces of the wafer and appreciably reduce the thermal impedance.

However, for all new devices of such types as rapid thyristors, power transistors, power integrated circuits and circuits comprising several functions in the same encapsulation, there are, on a single surface, various zones which must be coated with metal layers while remaining insulated from one another. If, further, as is the case for the units cited hereinabove, these zones overlap greatly, the formation of a contact by pressure on some of these zones only sets a difficult problem since it is essential to eliminate the dangers of short circuits.

One known solution consists in cutting in the surface having overlapping zones, compartments including the zones which must be insulated from the metal contact when the latter is pressed against this surface, during the formation of the semiconductor structure from a monocrystalline wafer.

This solution has the disadvantage of complicating the process for forming the semiconductor structure and correlatively the electrical performance of the structure.

Another known solution consists in forming on these various zones metal layers having different thickness. A metal contact with a very plane surface pressed against the surface bearing these metal layers then comes into contact only with the thickest layers. Two metal layers with different thicknesses are generally formed in two successive stages. During each of these stages, firstly metal is deposited by evaporation in a vacuum over the whole surface of the plate, then the metal deposited on some zones is removed by photoengraving. Each of these stages is expensive. Further, the differences in thickness obtained are small (15 to 20 microns) and make it necessary to take precautions to prevent short-circuits. The use of a single metal deposit by evaporation in a vacuum can be considered. But the following photoengraving operation must then allow the metal to be removed completely in some zones, to keep its whole thickness in other zones and to reduce its thickness without removing it completely in still other zones. Known photoengraving methods do not make it possible to cary out such an operation economically and reliably.

Preferred embodiments of the present invention provide a method of manufacturing power semiconductors with pressed contacts in which various zones of a surface of a semiconductor wafer can be formed economically with layers which are in good ohmic contact with the wafer and which have large differences in thickness from one zone to another together with a perfectly plane upper surface.

SUMMARY OF THE INVENTION

The present invention provides a method of manufacturing power semiconductor devices with pressed contacts comprising the following stages.

A monocrystalline semiconductor wafer of silicon is formed in which semiconductor junctions are formed, a first surface of this wafer comprising at least a first, a second and a third zone.

Formation of a contact plate fixed on the second surface of the wafer is effected.

By serigraphic deposition, a first contact electrode and a second contact electrode is deposited on said first and second zones respectively with the thickness of this second electrode being greater than that of the first.

A first metal contact unit and a second metal contact unit disposed on said electrodes and on said plate respectively are formed, constituting the main terminals of the said device.

Clamping means formed for pressing said two contact units against said plate, so as to ensure contact of the first contact unit with the second electrode and of the second contact unit with said contact plate.

The stage of forming a first contact electrode and second contact electrode comprises the following steps:

A first continuous thin metal layer of aluminum is deposited on said first surface of the semiconductor wafer providing good ohmic contact on the plate, before said serigraphic deposition.

Local etching of said first metal layer is effected to cause it to remain only on said first and second zones.

The deposit by serigraphy is in the form of a thick layer of paste on said second zone, this paste containing a proportion of metal by weight of more than 50% and a viscous binding agent.

The layer of paste is baked at a temperature of less than 577° C. for a sufficient time to remove the binding agent of the paste so as to transform this layer of paste into a second compact metal layer.

The method known by the name of serigraphy has already been applied to the depositing of metal layers of hybrid circuits to ensure electric connection between the metall terminals of various electronic components fixed on a same insulative plate.

It was not however considered as applicable to the manufacturing of a component, perhaps because it had or seemed to have in particular, the disadvantages of;

poor electric contact with the semiconductor material and difficulty in obtaining a sufficiently precise devinition.

The inventors have found that this known method is applicable to the manufacturing of power components provided the precautions indicated below are taken, and that it then has great advantages.

A description having no limiting character will be given of how the invention can be implemented with reference to the accompanying drawings.

BRIEF DESCRIPTION OF THE DRAWINGS

FIGS. 4 to 9 show cross-sections through an axial plane of a part of a device in accordance with the invention during various stages of its method of manufacturing.

DESCRIPTION OF THE PREFERRED EMBODIMENT

Figure 1:
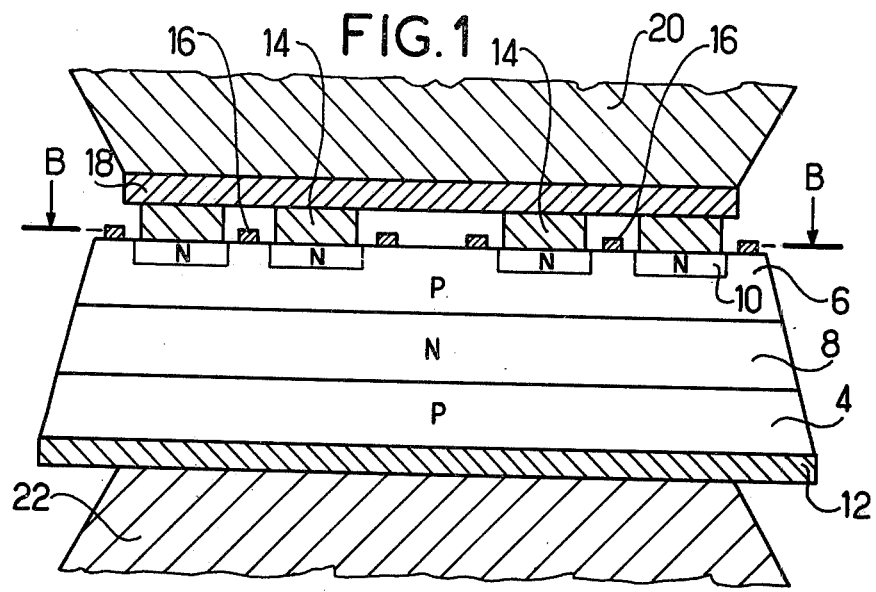
FIG. 1 shows a cross-section through an axial plane AA of a part of a device manufactured in accordance with the invention.

The method in accordance with the invention aims to obtain a product such as the device which will be described in its final state with reference to FIGS. 1, 2 and 3. This device is a power thyristor with an interdigitated cathode-gate structure. It comprises a monocrystalline silicon wafer 2 comprising, in a known way, semiconductor junctions separating it into two P-type layers 4 and 6 and two N-type layers 8 and 10. The layer 10 forming an emitter is divided on the upper surface of the plate 2 into several regions separated by the layer 6. From bottom to top, there are the layer 4, the layer 8, the layer 6 and, where it exists, the layer 10. In such a semiconductor structure, the main current flows from the layer 4 to the layer 10. A control signal can be applied to the layer 6 by means of a first contact electrode 16 and the part of the upper surface covered by it constitutes the "first zone" previously mentioned.

To allow the main current to pass, an anode plate 12 is brazed to the lower surface of the wafer 2. It is constituted by a material having a coefficient of thermal expansion close to that of silicon, e.g., tungsten or molybdenum. Nonetheless the coefficients of expansion are not perfectly matched, and consequently, because of the high temperature of the brazing, the assembly has a tendency to curve on cooling. Thus a device having a diameter of 50 mm can have the appearance of a watch glass with a dip of 40 to 50 microns. The thermal and electrical contact with the contact pieces of the encapsulation is therefore reduced in spite of the flexibility of the materials when under pressure. As for the upper surface, a second contact electrode 14 is disposed on a part of the emitter layer 10, this part forming the second zone of this surface. The first contact electrode 16 is disposed on the layer 6. The electrodes 14 and 16 allow respectively, contact with the emitter and the gate. An adaptor plate 18 constituted by the same material as the plate 12 is placed on the second metal covering 14 which is chosen to be thicker than the first metal covering so as to avoid contact between this first metal covering and this adaptor plate. The upper face of the electrode 16 as obtained is plane, i.e., exempt from the curvature caused by brazing, by virtue of the method in accordance with the invention as described below. Two contact pieces 20 and 22, made of solid copper are applied against the upper surface of the plate 18 and against the lower surface of the plate 12 respectively with sufficient pressure to ensure good electrical and thermal contact. The first and second contact units previously mentioned are constituted by the assembly formed by the contact piece 20 and the adaptor plate 18 and by the contact piece 22 respectively. The third zone previously mentioned of the upper surface of the plate is that which has no electrode.

When the difference in voltage between the electrodes 14 and 16 is small, a difference of the order of the 15 microns is sufficient for insulation. But when this voltage difference is higher, greater than 30 volts for example, such a difference in thickness no longer makes it possible to ensure suitable insulation.

Figure 2:
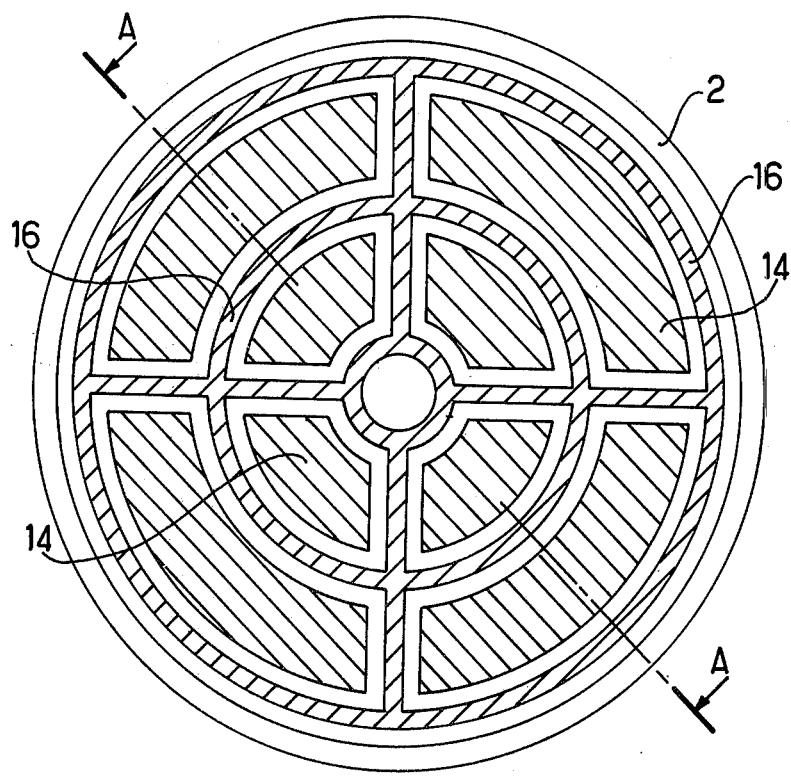
FIG. 2 shows a cross-section of the part of the device in FIG. 1, through a plane BB perpendicular to the axis.
Figure 3:
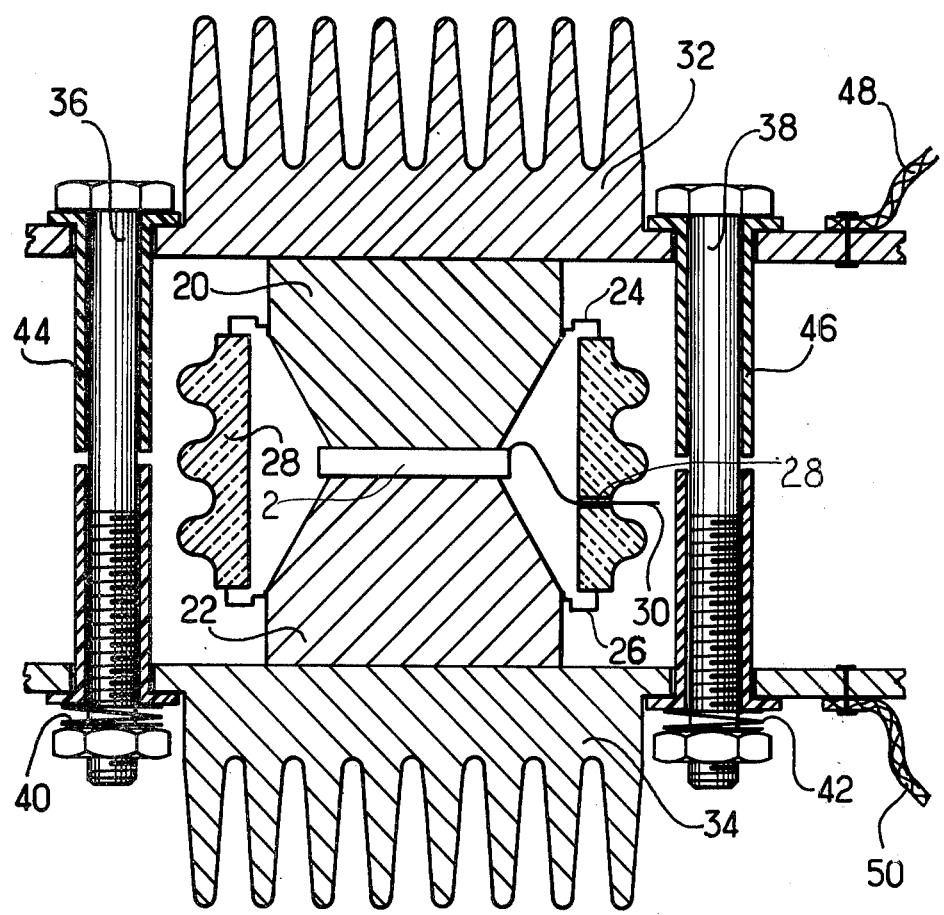
FIG. 3 shows a cross-section of the device of FIG. 1 through an axial plane on a smaller scale than that of FIG. 1.

FIG. 3 illustrates clamping and cooling means of a known type and completes FIGS. 1 and 2.

On the lateral wall of the two contact pieces 20 and 22 there are brazed two horizontal metal covers 24 and 26 connected together by a ceramics coupling 28 having a cylindrical shape with a vertical axis so as to constitute a cylindrical encapsulation containing the wafer 2, whose two covers 24 and 26 have the contact pieces 20 and 22 passing through them which project on the exterior of the encapsulation. These two covers are sufficiently resilient for the pressures exerted on the protruding part of either of these contact pieces to be transmitted to the wafer 2.

A gate conductor 30 constituting the auxiliary conductor previously mentioned is formed by a metal wire connected to the peripheral part of the gate electrode 16, this part not being covered by the adaptor plate 18. It passes through the coupling 28 through a sealed passage.

Two metal radiators 32 and 34 are applied against the interior faces of the contact pieces 20 and 22. They are connected together by two metal bolts 36 and 38, resilient washers 40 and 42 being interposed, so as to exert a pressure on the contact pieces 20 and 22. Insulating sleeves such as 44 and 46 are disposed so as to insulate the bolts 36 and 38 electrically from the radiators 32 and 34. Two main conductors 48 and 50 are connected to the radiators 32 and 34 respectively.

FIGS. 4 to 9 illustrate the production of the previously mentioned first and second electrodes. They are obtained by depositing two successive metal layers, with local removal of the first.

One of the methods used preferably for depositing the first layer is evaporation of aluminum in a vacuum but any other metal deposition method is applicable: deposition by cathode sputtering, by a chemical or by an electrochemical method. It is sufficient for the speed to allow thickness of several microns to be reached at each operation.

The metal is locally removed preferably by known photoengraving methods using sensitive resins of known type: KMER or KFTR, which are sensitized through a photographic negative. The metal is then etched in the openings by means of an appropriate solution. However, any other engraving method using metal masks, or wax or lithographic techniques could be used.

The formation of the electrodes 14 and 16 of the thyristor shown in FIGS. 1, 2 and 3 will now be described.

1st phase:

Continuous deposition of a first metal layer 80 of aluminum for example, by evaporation in a vacuum with a thickness of 10 microns, on a semiconductor structure 82, the result being shown in FIG. 4.

2nd phase:

Continuous deposition of photosensitive resin 84 on the metal layer 80, the result being shown in FIG. 5.

3rd phase:

Exposure of the resin 84 to light through a photographic mask (not shown), hiding the third zone, and revelation, i.e., removal of the resin from the non-exposed places, the result being shown in FIG. 6.

4th phase:

Etching of the metal to remove the layer 80 through its whole thickness in the openings of the resin 84, the result being shown in FIG. 7.

5th phase:

Removal of the remaining resin, the result being shown in FIG. 8.

The first electrode 16 is then finally formed.

6th phase:

Depositing by seripgraphy of a 30 micron thick metal layer 86, on the layer 80 in the second zone. To do this, a screen of the nylon fabric type (not shown) is used.

This screen is constituted by nylon threads with a diameter of 5 microns and comprises 13 threads per millimeter in both perpendicular directions. Its mesh is filled in the first and third zones by a varnish.

A 30 micron thick layer of paste type No. 7713 made by the American firm Dupont de Nemours is applied on this screen. This paste contains 70% by weight of silver. It is forced through the free mesh of the screen by means of a moveable scraper, in a conventional serigraphy machine. The straight edge of the scraper moves over a plane surface which makes it possible to obtain a deposit whose upper surface is likewise planar.

The method in accordance with the invention thus compensates for the curvature due to the different coefficients of thermal expansion of the materials brazed to the silicon.

7th phase:

The non-metal binding agent is removed from this paste by baking for 15 minutes at 510° C.

Thus a compact metal layer 86 is obtained which has good contact with the layer 80 and forms, with that layer, the electrode 14.

Baking also provides a good ohmic contact between the layer 80 and the semiconductor wafer.

It should be observed that the baking temperature chosen is less than the temperature of 540° C. proposed by the manufacturer of the paste used. Indeed, care should be taken not to reach the temperature of 577° C. which would provoke immediate alloying of the aluminum with the silicon. This is why a paste is chosen which is capable of being baked at a temperature preferably lower than 530° C. Further, it is an advantage for the paste chosen to contain a high proportion of metal for the layer obtained to be compact. This proportion must be greater than 50% and preferably greater than 65% by weight.

Further, the paste chosen must be free from impurities such as lead which are liable to affect the quality of the underlying structure. It has been found in particular that some aluminum pastes are not suitable.

The example described previously relates to a thyristor, but the invention is evidently applicable to other pressed contact devices, for example bipolar power transistors or field effect transistors such as power gridistors as well as to power integrated circuits.

Preferred embodiments of the present invention can provide the following advantages:

possibility of making contacts on both sides of plane type junctions while keeping the protective oxide on the flush line of the junctions;

very fine definition and excellent reproducibility of the contact zones due to the photoengraving;

possibility of making contacts on a zone with a well-known concentration of doping impurities, while in the case where some contacts are made after the surface of the semiconductor plate has been hollowed out, the concentration of impurities at the bottom of the hollow is not well known;

large contact area on the surface having overlapping zones, this improving the homogeneity of temperatures and of current in the semi-conductor structure. This advantage is considerable for high-power transistors through which several tens of amps flow for example, for it pushes back the "second breakdown" limits and thus increases the power that the transistor can dissipate;

great difference in thickness between the first contact metal covering the second contact metal covering and consequently removal of the danger of short-circuits;

low cost price, since a single masking operation is necessary; and the possibility of compensating the curvature of the wafer, since this curvature results in differences in level of the coated surface which are much smaller than the difference in thickness between the two metal coverings. This compensation is automatic in conventional serigraphy machines when the metal paste is applied through the screen, since the scraper which applies the paste has a rectilinear edge which moves along a plane surface so as to form a layer with a plane surface.

What we claim is:

1. In a method of manufacturing power semiconductor devices with pressed contacts comprising the following stages:

formation of a monocrystalline semiconductor wafer of silicon in which semiconductor junctions are formed, a first surface of this wafer comprising at least a first, a second and a third zone;

formation of a contact plate fixed on the second surface of the wafer;

formation by serigraphic deposition of a first contact electrode and of a second contact electrode on said first and second zones respectively, the thickness of this second electrode being greater than that of the first;

formation of a first metal contact unit and of a second metal contact unit disposed on said electrodes and on said plate respectively and constituting the main terminals of the device; and formation of clamping means pressing said two contact units against said plate, so as to ensure contact of the first contact unit with the second electrode and of the second contact unit with said contact plate; the improvement wherein said stage of forming a first contact electrode and second contact electrode comprises the following steps:

depositing a first continuous thin metal layer of aluminum on said first surface of the semiconductor wafer providing good ohmic contact on the plate, before said serigraphic deposition;

local etching of said first metal layer to cause it to remain only on said first and second zones;

said deposit by serigraphy being in the form of a thick layer of paste on said second zone, said paste containing a proportion of silver by weight of more than 50% and a viscous binding agent; and baking the layer of paste at a temperature on the order of 510° C. to 540° C. for a sufficient time to remove the binding agent of the paste to transform said layer of paste into a second compact metal layer.

2. A method according to claim 1, wherein said baking is carried out at a temperature of less than 530° C.

3. A method according to claim 1, wherein said paste is a silver paste cntaining a proportion of metal by weight of higher than 65%.

* * * * *